United States Patent [19]
Kellie

[11] 4,153,457
[45] May 8, 1979

[54] HIGH RESOLUTION HALFTONE MICROIMAGES AND METHOD THEREFOR

[75] Inventor: Truman F. Kellie, North St. Paul, Minn.

[73] Assignee: Minnesota Mining and Manufacturing Company, St. Paul, Minn.

[21] Appl. No.: 869,619

[22] Filed: Jan. 16, 1978

[51] Int. Cl.² .................. G03C 5/04; G03C 11/00
[52] U.S. Cl. ......................... 96/27 H; 96/45; 96/46; 96/116; 96/118
[58] Field of Search ............. 96/27 H, 46, 116, 117, 96/118, 45

[56] References Cited

U.S. PATENT DOCUMENTS

| | | | |
|---|---|---|---|
| 3,589,899 | 6/1971 | Hersh | 96/46 |
| 3,748,019 | 7/1973 | Bestenreiner et al. | 96/27 H |
| 3,885,971 | 5/1975 | Kato | 96/116 |
| 3,992,206 | 11/1976 | Lamberts | 96/81 |
| 4,069,049 | 1/1978 | Reich et al. | 96/27 H |

*Primary Examiner*—J. Travis Brown
*Attorney, Agent, or Firm*—Cruzan Alexander; Donald M. Sell; William B. Barte

[57] ABSTRACT

High resolution microimages of continuous tone photographs must be prepared in halftone form to enable inexpensive duplication of the microimages by conventional graphic arts processes. The halftone pattern in such microimages must have a spatial frequency of not less than about 40 line pairs per millimeter in order to enable the projection of an acceptably detailed enlarged image. In the present invention, such halftone microimages are prepared using an ultra-high resolution gradient density screen having therein an image of an interference fringe field resulting from an exposure of a preform of the screen to two interferring mutually coherent beams of radiation.

24 Claims, 9 Drawing Figures

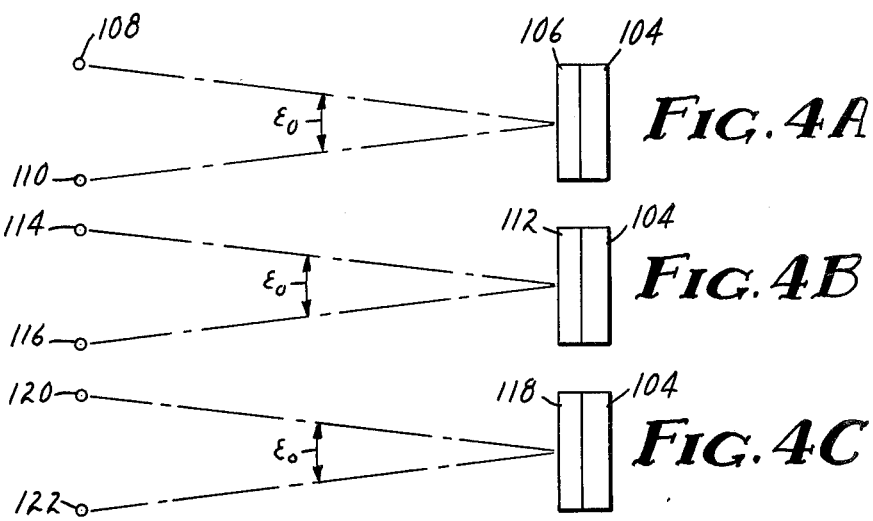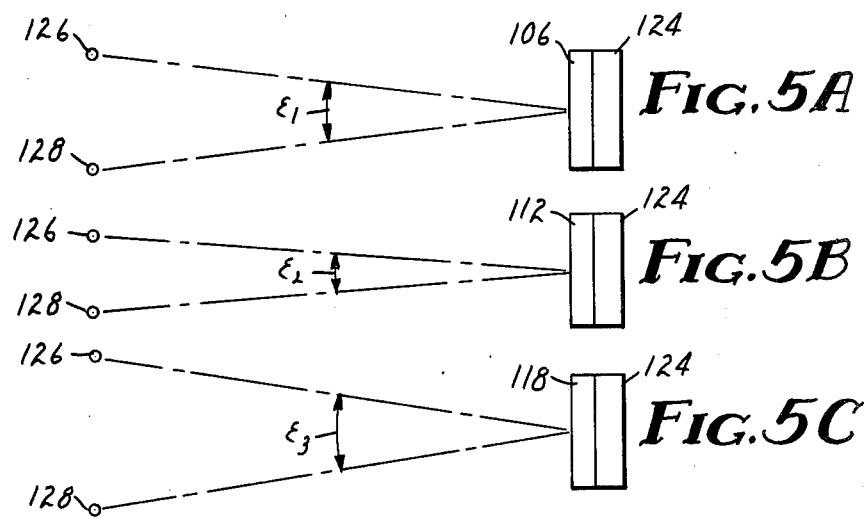

HIGH RESOLUTION HALFTONE MICROIMAGES AND METHOD THEREFOR

BACKGROUND OF THE INVENTION (1) Field of the Invention

This invention relates to the formation of halftone microimages and in particular to the use of halftone screens suitable for use in ultra-high resolution printing processes, wherein the halftone screens are formed by interferring coherent light beams.

(2) Description of the Prior Art

To reproduce an original continuous tone record such as a photograph or especially a microfilm record via conventional printing processes, it is first necessary to convert the original continuous tone record into a halftone print. In such a print, the record is subdivided into an array of evenly spaced dots or lines of various sizes in which larger dots or thicker lines represent the denser (darker) portions of the record, and thinner dots and lines represent the less dense (lighter) areas of the record. By varying the size of the dots or lines, a range of tone densities from very dark to very light can be obtained. The conversion of a continuous tone record into a halftone print useful in printing processes is an ancient art, going back at least to the sixteenth century, at which time, a continuous tone record was converted to a halftone print by carving the assembly of dots and/or lines into a block of wood or stone.

Since the advent of photography, many photomechanical processes have been described for making this conversion, wherein a halftone print of a continuous tone record is made by causing light from a record to pass through a screen having an array of dots or lines into a photosensitive material, which is then processed to provide the halftone print having dots or lines in graduated sizes corresponding to the various optical densities of the continuous tone record.

Generally, the halftone print or the printed replica is a one-to-one copy of the original continuous tone record, and is suitable for direct observation without enlargement. In such applications, a screen is used that has from about 2.5 to 8.0 lp/mm (line pairs per millimeter). Where the desired halftone print is a microimage, e.g., an image that is reduced in size, the use of screens having 8 lp/mm or even 20 lp/mm is not satisfactory, because when such microimages are viewed with enlargement of 20 to 30 times or more, the screened image is presented as an unacceptably coarse image.

U.S. Pat. No. 3,589,899 (Hersh) describes a method for optically converting a continuous tone image into a halftone image of reduced size by the steps of screening the original image with a screen having 200 lp/in. (8 lp/mm) and preferably simultaneously copying the image at a 2.4X reduction ratio, to produce a halftone image at about one-half the original size. The reduced halftone copy is then further optically reduced at a reduction ratio of 10 to 1 to obtain a microimage halftone print containing about 2000 lp/in. (80 lp/mm). Generally, microimages provided by such a process in which a screened halftone image is further reduced will exhibit a reduction in the number of grey level steps of contrast and in an accompanying loss of resolution. For example, a microimage halftone print so produced containing 80 lp/mm may exhibit approximately a 20 percent loss of grey level steps as a result of dot degradation during the imaging process when the microimage is subsequently reproduced in enlarged form.

SUMMARY OF THE INVENTION

In contrast with such prior art methods in which a screened halftone image is optically reduced to provide a halftone microimage, the present invention is directed to a method of forming a halftone microimage by first forming an ultra-high resolution gradient density screen which is subsequently screened onto a photosensitive medium together with a reduced image of an original continuous tone image to provide the desired halftone microimage. The ultra-high resolution gradient density screen is formed by exposing a first photosensitive medium to two mutually coherent beams of radiation directed onto the medium at different angles to provide an interference fringe field pattern in the medium. The respective angles of impingement and wavelengths are controlled according to the expression $$S = \frac{2 \sin \theta/2 \cos \phi}{\lambda}$$

where $S$ is the spatial frequency, $\theta$ is the angle between the two beams impinging onto the medium, $\phi$ is the angle between a line normal to the surface of the medium and a line bisecting the angle $\theta$, and $\lambda$ is the wavelength of the coherent beams, such that the spatial frequency $S$ of the interference fringe field pattern is between 40 and 250 line pairs per millimeter. Subsequent to the formation of the interference fringe field pattern in the medium, the medium is processed to transform the medium into the gradient density screen in which the interference fringe field pattern is permanently recorded as an array over which the optical transparency gradually varies.

The gradient density screen is preferably utilized as a contact screen, being placed in optical contact with the photosensitive medium on which the halftone microimage replica is to be formed. In such an embodiment, the continuous tone original image may be, for example, a transparency, photograph, even a three-dimensional object. Light modulated by this image is directed through a reduction lens and thence through the contact screen and onto the photosensitive medium to form therein a halftone microimage replica of the original continuous tone image. After such exposure, the medium is processed to provide a permanent halftone microimage of the continuous tone original image having a high contrast image of the gradient density screen therein, which microimage may be projected in enlarged form as an apparent continuous tone image having essentially no loss of grey level steps because the dots in the halftone screen are not imaged by a lens, and are therefore, not degraded. For example, a microimage having an image resolution of at least 120 lp/mm is readily obtainable, and will provide upon enlargement an original size image having a resolution of at least 5 lp/mm.

The photosensitive medium in which the halftone microimage is to be formed is desirably a high-contrast, high resolution medium such as a high contrast silver halide emulsion, diazo or other dye type medium, a photoresist, and may further include such materials coated over a readily volatilized metal, such that microfiche to which additional information may be subsequently included may be provided.

In particular, the present invention is especially adapted for processing continuous tone color transparencies. In one embodiment, a plurality of such transparencies, such as an array of 35 mm color transparencies may be provided, and converted into a halftone color microfiche. In another embodiment, the color transparencies may be converted into halftone microimage color separations. Generally, in color separations, any degradation of color density levels for any of the three primary colors results in color error upon recombination. In forming separations pursuant the present invention, light of three colors is successively directed onto the continuous tone color transparencies such that the photosensitive medium exposed to each of the primary colors has formed therein a halftone microimage of that color component of the original colored image. Three successive exposures on separate photosensitive media thus results in the formation of a set of color separations in which substantially no degradation of color density levels has occurred, and which if in transparency form, may be viewed in superposition to reconstruct an apparent continuous tone image. If each separation is illuminated by the proper color filtered light, an apparent continuous tone multicolor reconstructed image is obtained.

In another embodiment, the method of the present invention includes the use of such color separations to provide dye-free halftone tricolor microimages. In such an embodiment, a single panchromatic photosensitive medium is successively placed in contact with each of the color separation positives and is exposed to two interferring beams of mutually coherent radiation in a manner such that the color information in each separation is recorded in the panchromatic medium as interference fringe field patterns, each of which patterns has a spatial frequency which is different for each primary color and is modulated by the color information in that separation positive.

BRIEF DESCRIPTION OF THE DRAWING

FIGS. 4A-4C and 5A-5C are diagrams of optical systems for forming tricolor microimages pursuant the present invention.

DESCRIPTION OF THE PREFERRED EMBODIMENTS

Figure 1:
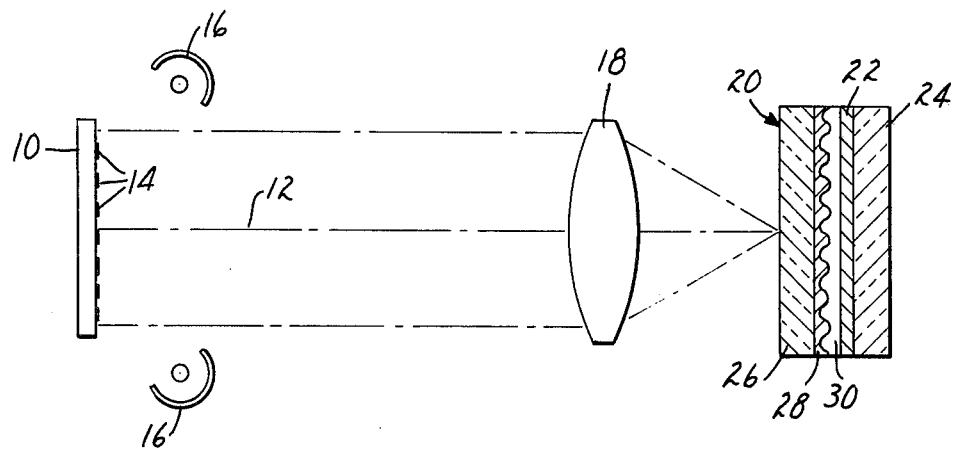
FIG. 1 is a diagram of an optical system for performing the method of the present invention.

A preferred method according to the present invention for providing high resolution halftone micorimages of a continuous tone original image or object and which can be enlarged and viewed as an apparent continuous tone image is best described with reference to FIGS. 1 and 2. Referring first to FIG. 1, a continuous tone object 10, such as a photograph, transparency, or three-dimensional object is centered about an optical axis 12. In FIG. 1, the object 10 is shown to be a photograph having an image containing printed indicia 14, and is positioned on the axis 12 to enable light from sources 16 to be directed onto the object, such that light modulated by the indicia 14 is directed toward a reducing lens 18. The reducing lens in turn focuses the modulated light onto the assembly 20, such that there is formed at the focal point of the lens a microimage of the continuous tone object 10. The reducing lens 18 and its relative placement are preferably chosen so that the projection of the object 10 is reduced to a microimage having a 9 mm×12 mm or similarly small sized format. For example, if the original object is an 8½×11 inch printed sheet, a standard 24X reducing lens will provide such a 9×12 mm format.

The assembly 20 includes a photosensitive layer 22 carried by a support layer 24, such as any dimensionally stable material, i.e., polyester or preferably a glass sheet. The photosensitive layer 22 is in turn placed in substantial contact with a high frequency gradient density screen 26 positioned such that the gradient density portions 28 thereof are directed toward the photosensitive material 22. The screen 26 is described in detail hereinbelow, and has an array of lines or dots on one surface of a suitable transparent support layer 28, such as glass, polyester or cellulose acetate. The array has a spatial frequency in the range between 40 and 250 line pairs per millimeter. Preferably, an index matching fluid 30 is placed therebetween to minimize reflections at the interface. Thus, for example, since the photosensitive medium and the gradient density screen typically have an index of refraction of approximately 1.5, xylene which also has an index of refraction of 1.5 is desirably so used.

Upon the exposure of the image of the object 10 through the gradient density screen 26 and onto the photosensitive medium 22, there is formed in the medium 22 a latent microimage of the object 10 which is modulated by the gradient density screen 26 to provide a characteristic high frequency halftone pattern superimposed on the microimage. The exposed photosensitive medium 22 may then be separated from the assembly 20 an developed according to known processing techniques. The resultant processed microimage is then suitable for viewing in conventional microfilm readers. Because of the ultra-high resolution, i.e., high frequency of the gradient density screen used in the formation of the microimage, it will be observed as an apparent continuous tone enlarged image.

A suitable material adapted for use as the photosensitive medium 22 in the present invention may, for example, be any high resolution, high contrast photosensitive material such as silver halide emulsions or photoresists. Examples of suitable silver halide emulsions are Kodak Type 120-02 and Kodak Type 649F photographic plates, manufactured by Eastman-Kodak Company, and Agfa Types 10E75 and 10E56 plates, manufactured by Agfa-Gaevert Corporation.

The high frequency gradient density screen 26 shown in FIG. 1 is preferably made by a process best described with reference to FIG. 2. The high frequency gradient density contact screen 26 contains a periodic density distribution having lines or dots at a spatial frequency ranging between 40 and 250 line pairs per millimeter. Such screens are preferably formed in a photosensitive medium 34 upon exposure to two interferring beams of mutually coherent radiation. To effect such an exposure, the medium 34 is mounted on a suitable support member 36 to have a substantially planar surface perpendicular to an optical axis 38. The interferring beams of mutually coherent radiation are conveniently provided by a conventional laser 40 which is directed through a partially reflecting mirror 42 to provide a transmitted beam 44 and a reflected beam 46. These beams are then reflected from mirrors 48 and 50 toward the medium 34 through spatial filters 52 and 54, such as lens pinhole spatial filters, to ensure that effects of dust particles and other defects in the optical system are eliminated. Each beam passing through the respective filters 52 and 54 thus comprises a divergent beam 56 and 58, respectively, of radiation having a spherical wave front. Each diverging beam 56 and 58 is centered about an optical axis 60 and 62, which axes intersect at the surface of the medium 34 at an angle θ and thus exposes the photosensitive medium 34 to form a latent image of a substantially linear interference fringe field in the medium.

The medium 34 is positioned along the axis 38 such that a bisector of the angle θ forms an angle φ with respect to the axis 38. The spatial frequency of the resultant interference fringe field, and hence of the gradient density screen formed upon development of the medium 34, is expressed by the relationship $$S = \frac{2 \sin \theta/2 \cos \phi}{\lambda},$$

where S is the spatial frequency of the interference fringe field, θ and φ are defined above, and λ is the wavelength of the coherent beams provided by the laser 40.

In a preferred embodiment, the medium 34 is positioned such that the divergent beams 56 and 58 impinge at equal angles with respect to the axis 38, i.e., that the angle φ is equal to 0. Under such conditions, screens having a frequency between 40 and 250 line pairs per millimeter are obtained at converging angles (θ) ranging between 1.8 and 9.1° using impinging radiation of 6328 Å (red) beams, converging angles (θ) of 1.5 to 7.4° using 5145 Å (green) radiation, or converging angles (θ) of 1.3 to 6.6° using 4579 Å (blue) beams. The photosensitive medium 34 may be separated from the support 36 and developed according to known processing techniques as are conventional in photographic processing. Upon such development, gradient density screens having an array of substantially parallel lines across the surface of the medium are obtained.

In a specific example, a typical contact screen was prepared from a Kodak Type 1A High Resolution Plate. The plate was initially presensitized by a 22 second exposure to light from a tungsten 500 W. source passed through a 5455 Å ±50 Å interference filter. The pre-exposure was such as to provide an energy density of about 60 ergs/cm² on the plate, and thereby enhanced the sensitivity of the plate to subsequent exposure. As shown in FIG. 2, the pre-exposed plate was positioned with respect to an optical axis 38 such that φ was equal to zero, and was then exposed to light from a 5017 Å laser directed through appropriate mirrors to impinge upon the pre-exposed plate at an angle θ of 3.6° to thus expose the plate to a substantially linear interference fringe field having a spatial frequency of 120 line pairs per millimeter. Each beam was controlled to have equal intensity, and resulted in a peak exposure on the plate of about 540 ergs/cm². The plate was conventionally developed for four minutes in Kodak Special Developer D-165 to result in an average optical density of about 0.46, and was then fixed in Kodak Rapid Fix, washed and dried, thereby resulting in the finished gradient density screen.

In an alternative embodiment, where a dot pattern gradient density screen is desired, the photosensitive medium may be rotated about the axis 38 a desired amount, as shown by the arrow 64, and the medium 34 re-exposed. If the medium is rotated approximately 90° between the subsequent exposures, a substantially round dot pattern is obtained. Similarly, a partial revolution of the medium 34 will result in the formation of elliptical dot patterns.

Figure 3:
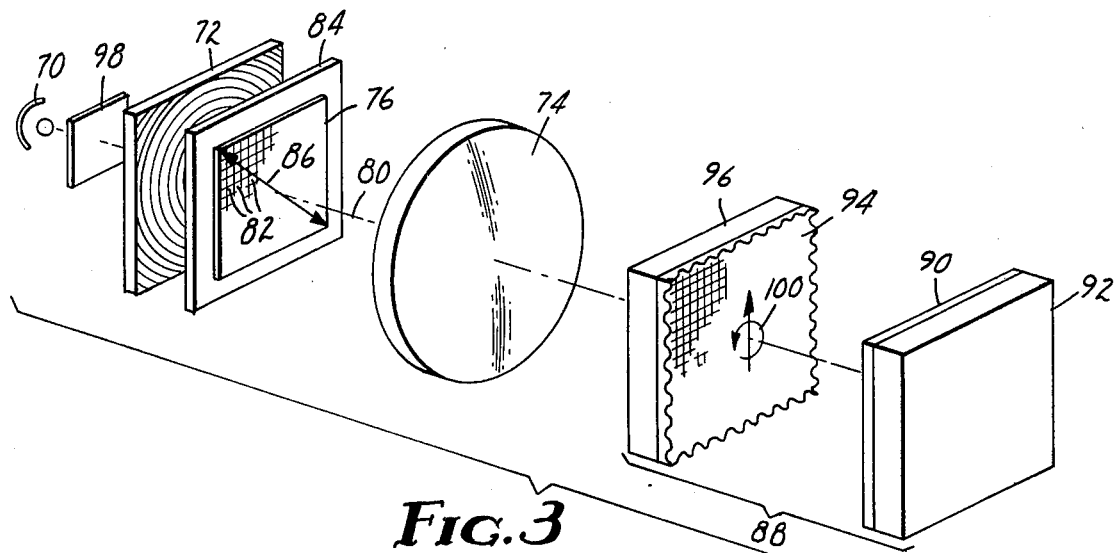
FIG. 3 is a perspective diagram of a preferred embodiment for forming microimages pursuant the present invention.

FIG. 3 sets forth a preferred embodiment of the present invention for providing high resolution halftone microfiche. The optical system for such an embodiment wherein a continuous tone transparent object is converted into a halftone microimaged transparency, comprises a light source 70, a condensing lens 72, and a reducing lens 74. In such an embodiment, light from the source 70 is directed along an optical axis 80 and is collected by the condensing lens 72 positioned at an appropriate optical location between the condensing lens 72 and the reducing lens 74. The transparent object 76 may be a single transparency, either black and white or multicolor, positive or negative image, and may, as shown in FIG. 3, be an array of reduced size transparencies 82 which are mounted on a rigid transparent support 84. Preferably, a plurality of 35 mm transparencies 82 are mounted in an X-Y array upon the support 84 such that the address of each transparency and each resultant microimage produced according to the present invention may be readily ascertained. A standard sized halftone microfiche may thus be formed by an arrangement of 7 vertical by 14 horizontal transparencies.

The condensing lens 72 is preferably a Fresnel type lens, having a diameter at least equal to the diagonal 86 of the array of transparencies, so as to provide effective optical condensing power over an extended area image. The lens 72 is generally positioned in a plane perpendicular to the axis 80 between the source 70 and the plane of the transparencies 76. The reducing lens 74 is a conventional high quality and well color corrected lens.

Light thus directed through the transparencies 82 is modulated by the information therein and is focused by the reducing lens 74 onto the assembly 88. The assembly 88 is substantially the same as the assembly 20 in FIG. 1, and is made up of a high resolution high contrast photosensitive medium 90 on a support member 92, such as that described above in conjunction with FIG. 1, and a high resolution gradient density screen 94 supported on member 96. Similarly, as shown in FIG. 1, an index matching liquid, not shown in FIG. 3, may be included between the members 90 and 94 to provide intimate optical contact, thereby reducing reflections. In FIG. 3 the assembly 88 is shown in an exploded view so as to more clearly depict the gradient density screen 94. The assembly 88 is placed on the optical axis 80 so that the modulated light from the reducing lens 74 passes through the gradient screen 94 to be further modulated in accordance with the interference fringe field pattern thereon before exposing the photosensitive medium 90. Subsequent to such exposure, the photosensitive medium 90 may be separated from the assembly 88 and developed according to known photographic processing techniques. Microfiche suitable for viewing at 24X magnification as an apparent continuous tone image in a microfiche reader are thereby obtained.

In a specific example in which a gradient density screen such as described above was used to form a black and white halftone microfiche as shown in FIG. 3, a 2×3 array of 35 mm black and white negatives was positioned as element 76 in FIG. 3. These negatives were then reduce-imaged at 2.4:1 through a gradient density screen of average density =0.78 and spatial frequency of 100 lp/mm. A 500 W. tungsten source filtered with a 5455 Å interference filter was directed through the condensing lens onto the 2×3 array and thence propagated into the reducing lens. The photosensitive medium 90, a Kodak High Resolution Plate Type 1A, was positioned in contact with the gradient density screen, using a liquid interface of xylene. The contacted members were then exposed such that the plate received a total exposure of approximately 1000 erg/cm$^2$. The plate was then processed for eight minutes in D-19 developer, followed by a two minute fix in Kodak Rapid Fix and a final wash. The result was a 2×3 array of 24X halftone microimages which when enlarged 24X on a standard microfilm reader were viewed as apparent continuous tone images.

A preferred embodiment for providing high resolution halftone microfiche from continuous tone color transparencies which are suitable for use as primary color separation positives may be prepared in a preferred embodiment as is also known in conjunction with FIG. 3. In such an embodiment, a number of separate pieces, generally three, but maybe more, of photosensitive media are each exposed to different suitably monochromatic light to produce in each medium a separation positive corresponding to a color component of the multicolor transparency. Thus, for example, in one embodiment, the light source 70 is selected to provide radiation corresponding to each of the primary colors, such that an image of one primary color component of the transparency 76 is projected onto a different piece of photosensitive media 90 during each of the respective exposures. Alternatively, as shown in FIG. 3, the source 70 is a conventional white or tungsten light source, and an appropriately colored filter 98 is inserted between the source 70 and the condensing lens 72 during each exposure. Equivalently, the filter 98 may be positioned between the transparency 76 and the reducing lens 74.

Figure 2:
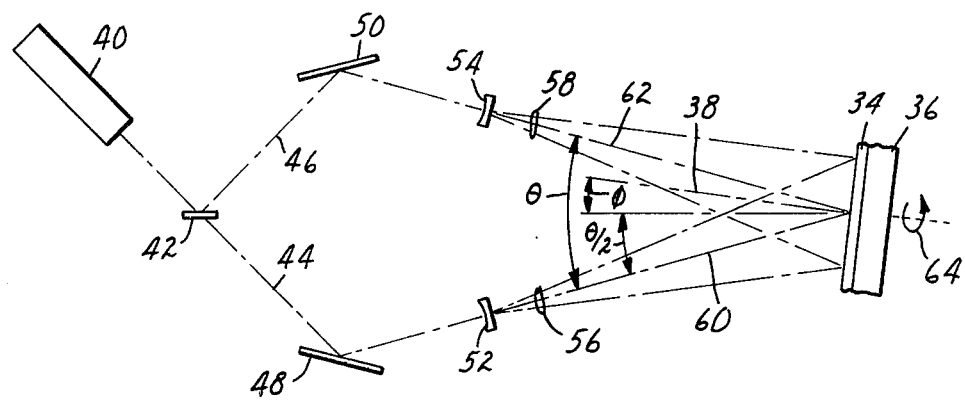
FIG. 2 is a diagram of an optical system for forming a high frequency gradient density contact screen according to the present invention.

Thus, following the specific example set forth above in conjunction with FIG. 2 for forming the gradient density screen, a green halftone microimage separation positive was prepared by placing a green color filter 98 over a 500 W. conventional projection lamp 70. The previously described 126 line pair per millimeter gradient density screen was contacted with a blue-green sensitive holographic plate (Agfa Type 10E56), having a single layer silver halide emulsion, together with an index matching liquid (xylene). The thus filtered light was directed through an array of 35 mm color negatives and focused by a 2.4:1 reducing lens onto the contacted assembly. After exposing the assembly to a total energy density of about 100 ergs/cm$^2$, the medium 90 was separated from the assembly 88 and suitably developed. A green microimage separation positive was thus obtained in which a 125 line pairs per millimeter halftone pattern was superimposed thereon.

In a similar manner, red and blue halftone microimage separations were obtained by replacing the green filter 98 with red and blue filters, respectively, and subsequent exposures and development of other pieces of photosensitive media. Preferably, in order to avoid the production of beat frequencies that may appear as objectionable lines and patterns in color images reconstructed from the three color separations, it is desirable that the orientation of the gradient density screen 94 be different during the green, red and blue exposures, and that the spatial frequency of the screen used for the green color separation be different from that used for the red and blue color separations. Thus, for example, a given gradient density screen 94 may be rotated between each exposure as shown by the arrow 100, or a set of gradient density screens 94, each of which is prepared having the desired spatial frequency and having the diffraction pattern arranged at a different angle with respect to the borders of the screen may be provided to facilitate ready exchange in conventional optical systems. Thus, for example, the green separation is desirably made with the gradient density screen 94 having a spatial frequency of 125 line pairs/mm and with the lines positioned horizontally, while the red separation is made with a screen having a spatial frequency of 100 line pairs/mm, with the lines positioned at −75° with respect to the horizontal axis. Similarly, the blue separation is desirably made with a screen having a spatial frequency of 100 line pairs/mm and the lines in the screen at +50° with respect to the horizontal axis. Any relative positioning which does not allow a spatial beat frequency of less than about 50 lines per millimeter is desirable for making such separations.

In another example in which a photoresist was utilized as the photosensitive material 90 as set forth in FIG. 3, a polyester sheet coated with a 900 Å layer of bismuth was subsequently coated with a 2$\mu$ layer of Shipley 1350J positive resist using spin coating. A preform for use in forming a halftone microimage was then prepared by exposing the photoresist layer on a Colight Xposer I duplicating vacuum frame unit having a 400 watt Mercury Arc Source for 25 seconds. The exposure was made through a high frequency screen having an average O.D. of 0.86 and a spatial frequency of 85 line pairs/mm, with the screen and the photoresist layer in intimate contact, to form a latent image of the screen in the photoresist layer.

Such a pre-exposed preform is particularly suitable for use in the preparation of printing plates and stamping tools in which the latent image of the gradient density screen eliminates the need for the end user to also handle and expose such screens, and enables the preparation of a halftone print by the single exposure to a continuous tone original.

In like fashion to the photoresist coated over bismuth as in the present example, photoresist materials may be coated over stamping masters containing surface relief diffraction gratings suitable for further processing to provide color coating such as, for example, that set forth in U.S. Pat. No. 3,957,354 (Knop), in order to provide zero order diffraction color images. A preform may then be formed by imaging a gradient density screen onto the photoresist as discussed above. The preform may then be subsequently exposed to a continuous tone microimage and the exposed photoresist suitably processed to selectively reveal portions of the surface relief substrate. An embossing master may then be formed which is suitable for low cost replication of diffraction color microimages in a manner well known to those skilled in the art. Other photosensitive materials may also be used to provide similar preforms.

In the example set forth above in which the Shipley photoresist overcoated on bismuth was used to provide a preform, the preform was subsequently contact-exposed to a continuous tone 24X multi-frame microfiche and a Stoeffer Graphic Arts Step Tablet on the same exposing unit used in the initial formation of the latent image in a conventional manner for 10 seconds. Subsequently, the photoresist layer was processed for one minute in a 1:1 solution of Shipley Type AZ Developer and water to yield a halftone 24X photoresist microimage array on the metal layer. Finally, the imagewise photoresist coated metal article was immersed in a 5% solution of FeCl$_3$ for 30 seconds, after which it was withdrawn, rinsed with acetone to strip the remaining photoresist, and dried. The resulting article was enlarged 24X on a standard microfiche reader and exhibited apparent continuous tone images. The image of the Step Tablet exhibited 7 distinct grey levels. In contrast, a similar exposure in which the gradient density screen was eliminated resulted in a high contrast image having but a single grey level.

In the embodiments described above, the gradient density screen was formed from a conventional high resolution silver halide emulsion. Alternatively, a desirable screen may be formed by providing as the photosensitive medium 34 in FIG. 2, a high resolution photoresist material. When such a material is exposed to the interferring mutually coherent beams of radiation, there is formed in the photoresist a latent image of the resultant interference fringe field pattern. Such a resist may then be conventionally processed to form a surface relief corresponding to the field pattern. The relief pattern may in turn be processed to enable relief replicas to be stamped into a colored sheet-like polymeric material such that the differences in the thickness of the colored polymeric material provide a variation in the transmissivity through the sheet corresponding to the relief pattern. A similar result is obtained using a colored photoresist material. Such sheets may be utilized as a high resolution gradient density screen in which the transmissivity as a function of the wavelength is dependent upon the coloring in the polymeric sheet.

In a further preferred embodiment of the present invention, a dye-free halftone tricolor linear grating microimage may be produced from the halftone separation described hereinabove in accordance with the method which is described in more detail in the copending application, Ser. No. 682,090, which application was filed on Apr. 30, 1976 and which is incorporated herein by reference. As shown in FIGS. 4A, 4B and 4C, in accordance with such a method, a high resolution high contrast panchromatic photosensitive medium is successively exposed to each of the separation color positives previously prepared. Thus, as shown in FIG. 4A, a red separation positive 106 may be placed in contact with the photosensitive medium 104 and exposed with interferring mutually coherent beams of red radiation such as provided from sources 108 and 110 respectively, which beams intersect at an angle $\epsilon_0$. The sources 108 and 110 may be readily provided by a red laser directed through mirrors similar to the configuration shown in FIG. 2. The red separation positive is then replaced with a green separation positive 112 as shown in FIG. 4B, and converging beams of green mutually coherent radiation from sources 114 and 116 are directed onto the medium at the same angle $\epsilon_0$ to further expose the medium 104. Finally, the green separation positive is replaced with a blue separation positive 118 and the exposure again repeated using sources of blue mutually coherent radiation from sources 120 and 122 directed onto the medium at the same angle $\epsilon_0$. The green and blue sources may likewise be readily obtained from lasers of the appropriate wavelength passed through redirecting mirrors as shown in FIG. 2. While not shown in FIGS. 4A, 4B and 4C for purposes of clarity, an index matching liquid will preferably be provided between the separation positives and the photosensitive medium as discussed above to minimize reflections between the associated members. Accordingly, there are produced in the photosensitive medium 104 three sets of superimposed linear gratings, each having a different spatial frequency, which gratings are modulated by the information in each of the respective color separation positives. Preferably, the medium 104 is rotated about an optical axis between each exposure such that the resultant gratings are nonparallel to each other. The spatial frequency of the intermodulation frequencies resulting from the interference between the fundamental gratings is thereby increased such that they fall outside the imaging aperture of a reconstruction device. After development of the imaged photosensitive medium 104, it may be used to form a master tricolor microimage hologram which may thereafter be replicated in a plastic type medium to provide inexpensive duplicates of the original continuous tone transparencies.

In an alternative embodiment for forming dye-free halftone tricolor linear grating microimages shown in FIGS. 5A through 5C, a high resolution high contrast photosensitive medium 124 is successively assembled together with the color separation positives 106, 112 and 118 and suitable index matching liquids therebetween, and each respective assembled members are exposed by two mutually coherent converging beams of a single wavelength which are directed onto the sets of assembled members at varying angles $\epsilon_1$, $\epsilon_2$, and $\epsilon_3$, respectively. Accordingly, the light impinging at the angle $\epsilon_1$ produces in the medium 124 a first linear diffraction grating having a given spatial frequency which is modulated by the green information from the separation positive 106. During the second exposure, with beams impinging at a smaller angle $\epsilon_2$, a second linear diffraction grating having a different spatial frequency modulated by the information in the red color separation positive 112 is formed in the medium 124. Similarly, during the exposure with the beams at a larger angle $\epsilon_3$, a third linear diffraction grating having a still different spatial frequency modulated by the information in the blue color separation positive 118 is formed in the medium 124.

While various types of photosensitive media may be used as the photosensitive medium 124, it is particularly preferred to use a material which may be made to undergo a change in the optical thickness that is directly related to the intensity of light in the stationary interference pattern during the exposures. Accordingly, a high resolution photoresist material such as Type 1350J manufactured by the Shipley Company, Newton, Massachusetts, may be desirably employed. Such a material may then be developed to form a surface relief pattern corresponding to the areas of varying intensity of the exposure. For example, the material may be processed to form holograms similar to the phase relief holograms disclosed in U.S. Pat. No. 3,703,407 (Hannan et al.). The relief pattern obtained by either of such procedures may be viewed directly or may be made into a stamping tool for metallizing the relief pattern. Such a metallized stamping master may then be used in accordance with conventional thermoplastic embossing techniques to produce replicas of the tricolor linear grating microimage.

Having thus described the present invention, what is claimed is:

1. A method of forming a halftone microimage comprising the steps of:
   (a) providing an ultra-high resolution gradient density screen by exposing a photosensitive medium to two mutually coherent beams of radiation directed onto said medium at different angles to provide an interference fringe field pattern in said medium having a spatial frequency defined by the expression $$S = \frac{2 \sin \theta/2 \cos \phi}{\lambda}$$

where S is the spatial frequency, $\theta$ is the angle between the two beams impinging onto the medium, $\phi$ is the angle between a line normal to the surface of the medium and a line bisecting the angle $\theta$, and $\lambda$ is the wavelength of said coherent beams of radiation, such that said interference fringe field pattern has a spatial frequency between 40 and 250 line pairs per millimeter, and processing said medium to transform the medium into said gradient density screen in which said interference fringe field pattern is permanently recorded as an image over which the optical transparency varies as a function of the exposure distribution, (b) directing a source of actinic radiation through said gradient density screen and onto a second photosensitive medium, and directing a source of actinic radiation onto a continuous tone original image and thence through reduction lenses and onto said second medium to form in said second medium a halftone microimage replica of said original image modulated by the interference fringe field pattern, and (c) processing said second medium to provide a permanent halftone microimage of said continuous tone original image having a high contrast image of said gradient density screen therein, which microimage may be projected in enlarged form as an apparent continuous tone image.

2. A method according to claim 1, wherein said gradient density screen is formed by impinging two mutually coherent means of radiation ranging in wavelength ($\lambda$) between approximately 4500 and 6500 Å at an angle ($\theta$) therebetween of between 1°–10° onto a surface of said medium positioned such that $\phi$ is equal to zero.

3. A method according to claim 1, wherein said step of providing the gradient density screen further includes the step of rotating the photosensitive medium with respect to the impinging beams after a first exposure and re-exposing the medium to two mutually coherent beams of radiation to provide a second interference fringe field pattern superimposed on the first formed field pattern, thereby providing a two-dimensional gradient density pattern.

4. A method according to claim 3, wherein said rotating step consists of rotating said photosensitive medium 90° with respect to its first position between successive exposures to two mutually coherent interferring beams to provide a composite interference fringe field pattern corresponding to a gradient density pattern having the same spatial frequency in two orthogonal directions.

5. A method according to claim 1, wherein said step of providing the gradient density screen comprises exposing a high resolution silver halide film to the mutually coherent beams of radiation to form in said film a latent image of said interference fringe field pattern, and thereafter processing the film to develop the latent image.

6. A method according to claim 1, wherein said step of providing the gradient density screen comprises exposing a sheet-like photoresist material to the mutually coherent beams of radiation to form a latent image of said interference fringe field pattern in the photoresist and processing the photoresist material to form a surface relief therein and to cause the material to become partially absorbing such that the differences in the thickness of the sheet provides a variation in the transmissivity through the sheet corresponding to the surface relief, thereby enabling the use of the sheet as said gradient density screen.

7. A method according to claim 1, wherein said step of providing the gradient density screen comprises exposing a photoresist material to the mutually coherent beams of radiation to form in said photoresist a latent image of said interference fringe field pattern, processing the photoresist to form a surface relief corresponding to said field pattern and forming a surface relief replica in a colored sheet-like polymeric material, such that the differences in the thickness of the sheet provides a variation in the transmissivity through the sheet corresponding to the surface relief, thereby enabling the use of the sheet as said gradient density screen.

8. A method according to claim 1, wherein said directing step includes the step of providing an array of continuous tone color transparencies such that a halftone replica of said array is formed in said second photosensitive medium.

9. A method according to claim 1 adapted for forming a halftone color separation including the steps of providing a multicolor continuous tone original transparency, passing light of a first color through said full color transparency and thence through said reduction lens to thereby expose said second medium with a microimage of said first primary component of said transparency, and processing said second photosensitive medium to provide a halftone microimage separation corresponding to said first color.

10. A method according to claim 9, further including the steps of successively imaging said full color transparency through separation color filters of second and third colors to provide a set of three halftone microimage color separations which may be superimposed to provide multicolor viewing with appropriate filtered light source.

11. A method according to claim 10 including the step of positioning said gradient density screen with respect to said second photosensitive medium such that the lines of each interference fringe field pattern imaged onto said second medium during each exposure are at a different angle from that imaged during the other exposures to prevent the production of beat frequencies otherwise appearing as objectionable lines and patterns in color images reconstructed from the three color separations.

12. A method of forming a halftone tricolor linear grating microimage according to claim 10, comprising successively placing each of said three halftone microimage color separations in contact with a high contrast panchromatic photosensitive medium and exposing each separation to two interferring beams of mutually coherent radiation of the same primary color as that represented by the color separation being exposed, to thereby provide three superimposed linear gratings, each of which has a different spatial frequency which corresponds to the color information of one of the halftone separations and which is modulated by the graphic information in that separation.

13. A method of forming a halftone tricolor linear grating according to claim 10, comprising successively placing each of said three halftone microimage color separations in contact with a high contrast photosensitive medium and sequentially exposing each separation to two interferring beams of mutually coherent radiation of a given frequency directed onto the contacted separation and photosensitive medium at a different angle with respect to the contacted media for each exposure to provide three superimposed linear gratings, each of which has a different spatial frequency which corresponds to the color information of one of the halftone separations and which is modulated by the graphic information in that separation.

14. A method according to claim 1, wherein said directing step includes the steps of positioning said gradient density screen in contact with said second photosensitive medium and directing radiation passed through said reduction lens through said contacted screen onto said second medium to form therein microimage replicas modulated by said interference fringe field pattern.

15. A method according to claim 1, wherein said directing step includes the step of simultaneously imaging said screen and original image onto said second photosensitive medium.

16. A method according to claim 14, wherein said simultaneous imaging step includes the step of positioning the gradient density screen in contact with the second photosensitive medium and imaging said original image onto the contacted screen and medium.

17. A preform for use in forming a halftone microimage, comprising a photosensitive medium having therein a latent image of an interference fringe field pattern, the spatial frequency of which is between 40 and 250 line pairs per millimeter, which latent image when developed in the medium forms an image of a gradient density screen of the same spatial frequency, such that when a continuous tone original image is optically exposed onto the preform, the developed medium will have formed thereon a halftone microimage of said continuous tone original image which because of the high spatial frequency, may be projected in enlarged form as an apparent continuous tone image.

18. A gradient density screen having spatial frequencies in the range of 40 to 250 line pairs per millimeter in two orthogonal directions, comprising a sheet-like medium having therein at least one substantially linear interference fringe field pattern extending across said medium and having a spatial frequency within said range of frequencies, said field pattern providing an array for use as an ultra-high resolution halftone screen for converting continuous tone images to halftone microimages.

19. A gradient density screen according to claim 18, wherein said sheet-like medium has therein at least two substantially linear interference fringe field patterns extending in different directions across said medium, each of which patterns has a spatial frequency within said range of frequencies and which cooperate to form an array of dots for use as said halftone screen.

20. A product according to the method of claim 1.

21. A product according to the method of claim 10.

22. A product according to the method of claim 12.

23. A product according to the method of claim 13.

24. A method according to claim 1 whereas the step of providing the ultra-high resolution gradient density screen includes exposing said medium to two vertically polarized, mutually coherent and equal intensity beams and exposing said medium to an incoherent source of substantially constant intensity over said medium under a predetermined set of conditions to cause the photosensitivity of said medium to lie within a desired range of its DlogE curve.

* * * * *